US009052365B2

(12) United States Patent
Ishihara

(10) Patent No.: US 9,052,365 B2
(45) Date of Patent: Jun. 9, 2015

(54) METHOD FOR TESTING LEAKAGE CURRENT OF ELECTRIC COMPRESSOR

(75) Inventor: Mitsugu Ishihara, Isesaki (JP)

(73) Assignee: SANDEN CORPORATION, Gunma (JP)

( * ) Notice: Subject to any disclaimer, the term of this patent is extended or adjusted under 35 U.S.C. 154(b) by 230 days.

(21) Appl. No.: 13/877,284

(22) PCT Filed: Sep. 16, 2011

(86) PCT No.: PCT/JP2011/071185
§ 371 (c)(1),
(2), (4) Date: Apr. 1, 2013

(87) PCT Pub. No.: WO2012/043269
PCT Pub. Date: Apr. 5, 2012

(65) Prior Publication Data
US 2013/0207664 A1    Aug. 15, 2013

(30) Foreign Application Priority Data

Sep. 30, 2010  (JP) .................................. 2010-220274

(51) Int. Cl.
*G01R 31/14*  (2006.01)
*G01R 31/34*  (2006.01)
*G01R 31/02*  (2006.01)

(52) U.S. Cl.
CPC ............. *G01R 31/34* (2013.01); *G01R 31/025* (2013.01)

(58) Field of Classification Search
CPC .... G01R 31/34; G01R 31/025; G01R 31/343; G01R 31/346; G01R 31/1277; G01R 31/12; G01R 31/02; G01R 31/06; H01H 31/12; B60L 3/0023
USPC ......... 324/511, 122, 551, 512, 522, 263, 177, 324/772; 702/57–59; 340/647; 318/490
See application file for complete search history.

(56) References Cited

U.S. PATENT DOCUMENTS

| 5,421,193 A | * | 6/1995 | Carlin et al. ................... 73/49.2 |
| 5,952,761 A | * | 9/1999 | Itoh et al. ...................... 310/215 |

(Continued)

FOREIGN PATENT DOCUMENTS

| JP | 2003-133189 | 5/2003 |
| JP | 2006-300532 | 11/2006 |
| JP | 2008-96158 | 4/2008 |

*Primary Examiner* — Huy Q Phan
*Assistant Examiner* — Thang Le
(74) *Attorney, Agent, or Firm* — Cozen O'Connor

(57) ABSTRACT

According to the present invention, after a predetermined voltage is applied to a coil in a state in which the inside of an electric compressor is filled with dielectric liquid and the coil of a motor is immersed in the dielectric liquid, in a first test process, a test product in which a current value when a first predetermined time T1 elapses I1 is less than or equal to a first reference current value is determined as an acceptable product, in a second test process, among the test products in which the current value is greater than the first reference current value in the first test process, a test product in which a current value I2 when a second predetermined time T2 longer than the first predetermined time elapses is less than or equal to a second reference current value is determined as an acceptable product, a test product in which the current value is greater than the second reference current value is determined as a disqualified product, and the first reference current value is a predictive reference current value that allows a test product which is to be determined as a disqualified product in the second test process to be determined as a disqualified product in the first test process, and allows some test products which are to be determined as an acceptable product in the second test process to be determined as a disqualified product in the first test process.

6 Claims, 4 Drawing Sheets

(56) References Cited

U.S. PATENT DOCUMENTS 6,182,502 B1 * 2/2001 Schwegler et al. ............ 73/49.2
2007/0132321 A1 * 6/2007 Park et al. ...................... 310/15
2008/0133168 A1   6/2008 Barrett

* cited by examiner

METHOD FOR TESTING LEAKAGE CURRENT OF ELECTRIC COMPRESSOR

RELATED APPLICATIONS

This is a U.S. national stage of application No. PCT/JP2011/071185 filed on Sep. 16, 2011.

This patent application claims the priority of Japanese application no. 2010-220274 filed Sep. 30, 2010, the disclosure content of which is hereby incorporated by reference.

TECHNICAL FIELD

The present invention relates to a method for testing a leakage current of an electric compressor to test whether or not a leakage current leaking from a coil of a motor of an electric compressor to a housing is a reference value or less.

BACKGROUND ART

A high insulation treatment is performed between a coil of a motor of an electric compressor and a housing accommodating the motor so that a leakage current is not generated under a contact environment with air; however, when the compressor is in operation, the coil and the inside of the housing are exposed to a contact environment of coolant and lubricating oil. Freon-based coolant and ether-based or ester-based lubricating oil which are commonly used are dielectrics, and hence, a leakage current from the coil to the housing through the coolant or the lubricating oil is likely to be generated. Furthermore, in a process of manufacturing the electric compressor, when the motor is installed and fixed to the housing, the coil of the motor may get damaged, and this damage may cause a large leakage current. The leakage current may flow to a control unit that controls driving elements such as an engine, a brake, and a power steering through a vehicle body, adversely affect control, and lead to a serious accident by causing the driving element to malfunction. Thus, a strict reference value as a quality acceptance criterion related to a leakage current is set to a product of an electric compressor, and it is tested whether or not a leakage current of a product is the reference value or less.

A total current I flowing to the dielectric when a direct current (DC) voltage is applied to the dielectric is a grand total of a charging current Ii, an absorption current Ia, and a leakage current IL as illustrated in FIG. 5. The total current I decreases according to a change in the absorption current Ia, gradually the decrease becomes slow, decreases until influence of the absorption current Ia disappears, and finally converge to the leakage current IL. In order to measure a leakage current, it is necessary to wait until the total current converges and measure a current after converging, and it takes a long time until the total current converges. For this reason, in accurate measurement of a leakage current, a current after 10 minutes after a DC voltage is applied to the dielectric is commonly dealt as a leakage current.

A method of testing a leakage current in a short time is disclosed in Patent Document 1 is proposed. In this method, in order to test a leakage current of a capacitor, after the capacitor is charged to a setting voltage, the capacitor is charged to maintain the setting voltage, a stationary current flowing while the setting voltage is being maintained is measured, and the leakage current is measured based on the stationary current, and the leakage current can be easily tested in a short time.

CITATION LIST

Patent Document

Patent Document 1: Japanese Laid-Open (Kokai) Patent Application Publication No. 2003-133189

SUMMARY OF THE INVENTION

Technical Problem

When the leakage current of the electric compressor is tested, if all mass-produced products are tested such that the leakage current of each product is tested for a long time of 10 minutes, a total time taken for a test is enormous, and the test efficiency is lowered. However, a test time for an individual product is reduced to improve the test efficiency, it is difficult to accurately test the leakage current, and the test accuracy is lowered. In addition, in the method discussed in Patent Document 1, when the capacitor has high capacitance, it takes a long time to charge to the setting voltage. Since the electric compressor exposed to the coolant and the lubricating oil shows electric behavior similar to that of the high-capacitance capacitor, in this method, in order to test the leakage current of the electric compressor, a long charging time is necessary, and thus it is difficult to complete a test in a short time. Therefore, it is an object of the present invention to provide a method for testing a leakage current of an electric compressor with the high test efficiency and the high test accuracy.

Solution to Problem

In order to achieve the above object, the present invention provides a method for testing a leakage current of an electric compressor in which a predetermined voltage is applied between a coil and a housing of an electric compressor in a state in which an inside of the electric compressor is filled with dielectric liquid and the coil of the motor is immersed in the dielectric liquid, and then, a leakage current flowing from the motor to the housing of the compressor is tested when a predetermined time elapses. The method includes a first test process of determining a test product in which a current value when a first predetermined time elapses is less than or equal to a first reference current value as an acceptable product and determining a test product in which the current value is greater than the first reference current value as a test target product in a second test process, and the second test process of determining, among the test products in which the current value is determined to be greater than the first reference current value in the first test process, a test product in which a current value when a second predetermined time longer than the first predetermined time elapses is less than or equal to a second reference current value as an acceptable product, and determining a test product in which the current value is greater than the second reference current value as a disqualified product. The first reference current value is a predictive reference current value that allows a test product which is to be determined as a disqualified product in the second test process to be determined as a disqualified product in the first test process, and allows some test products which are to be determined as an acceptable product in the second test process to be determined as a disqualified product in the first test process, and the second reference current value is an acceptance reference current value used to finally decide whether or not a leakage current of a test product is acceptable.

According to this configuration, since the acceptable product of the first test process is not a test target of the second test process, when a first predetermined time after a voltage is applied is represented by T1, a second predetermined time is represented by T2, a total of the number of test products is represented by S, and the number of acceptable products in the first test process is represented by A, a test time can be reduced by $(T2-T1)S-T2(S-A)$ compared to when a test is performed by spending a test time T2 on each of all test products of which total number is S. Furthermore, in the first test process, a test product which is to be determined as a disqualified product in the second test process is determined as a disqualified product, and thus the leakage current of the acceptable product of the first test process can be guaranteed to be less than or equal to the second reference current value (the acceptance reference current value) of the second test process. In addition, in the second test process, all disqualified products of the first test process are tested based on the second reference current value (the acceptance reference current value), and thus even when a test product which is to be determined as an acceptable product in the second test process is included among some disqualified products of the first test process, the test product can be tested as the acceptable product in the second test process. Thus, according to this configuration, the same test result as a result of testing whether all the test products are acceptable using one acceptance reference current value can be obtained, and the test time necessary for a 100% test can be reduced.

According to the present invention, in the above configuration, preferably, an intermediate test process is further provided between the first test process and the second test process, the intermediate test process uses a test product in which the current value is determined to be greater than the first reference current value in the first test process as a test target, the intermediate test process determining a test product in which a current value when a predetermined intermediate time between the first predetermined time and the second predetermined time elapses is less than or equal to an intermediate reference current value as an acceptable product, and determining a test product in which the current value is greater than the intermediate reference current value as a test target product in the second test process, and the intermediate reference current value is an intermediate value between the first reference current value and the second reference current value, and is a predictive reference current value that allows a test product which is to be determined as a disqualified product in the second test process to be determined as a disqualified product in the intermediate test process, and allows some test products which are to be determined as an acceptable product in the second test process to be determined as a disqualified product in the intermediate test process.

According to this configuration, the acceptable products of the first test process and the intermediate process are not a test target of the second test process, and thus when the first predetermined time is represented by T1, the predetermined intermediate time is represented by Tm, the second predetermined time is represented by T2, the number of all test products is represented by S, the number of acceptable products of the first test process is represented by A, and the number of acceptable products of the intermediate test process is represented by B, a test time can be reduced by $(T2-T1)S-Tm(S-A)-T2(S-A-B)$ compared to when a test is performed by spending a test time T2 on each of all test products of which total number is S. Furthermore, in the first test process and the intermediate test process, the test product which is to be determined as a disqualified product in the second test process is determined as a disqualified product, and thus the leakage current value of the acceptable product of the first test process and the intermediate test process can be guaranteed to be less than or equal to the second reference current value of the second test process. Furthermore, in the second test process, all disqualified products of the intermediate test process are tested based on the second reference current value (acceptance reference current value), and thus even when a test product which is to be determined as an acceptable product in the second test process is included among some disqualified products of the intermediate test process, the test product can be tested as the acceptable product in the second test process. Thus, according to this configuration, the same test result as a result of testing whether all test products are acceptable using one acceptance reference current value can be obtained, and the test time necessary for a 100% test can be further reduced.

Preferably, based on measurement data of a current value when the first predetermined time elapses and a current value when the second predetermined time elapses in a plurality of electric compressors serving as a sample, a lower limit confidence interval curve of a predictive value is obtained by a regression analysis method, and the first reference current value is obtained using the lower limit confidence interval curve and the second reference current value. Preferably, based on measurement data of a current value when a predetermined intermediate time between the first predetermined time and the second predetermined time elapses and a current value when the second predetermined time elapses in a plurality of electric compressors serving as a sample, a lower limit confidence interval curve of a predictive value is obtained by a regression analysis method, and the intermediate reference current value is obtained using the lower limit confidence interval curve and the second reference current value. The second reference current value is an acceptance reference current value when the predetermined dielectric liquid is used, and decided as a production performance requirement value. The second reference current value (acceptance reference current value) may be decided as the production performance requirement value. Preferably, the dielectric liquid is a coolant, lubricating oil, or a mixture thereof, and moisture content of the dielectric liquid is 200 ppm or less.

Effects of the Invention

In a method for testing a leakage current of an electric compressor according to the present invention, compared to when a 100% test is performed using one acceptance reference current value, a total test time necessary for a 100% test can be reduced, and the same test accuracy as a case in which all test products are tested using one acceptance reference current value can be obtained.

DESCRIPTION OF EMBODIMENTS

Figure 1:
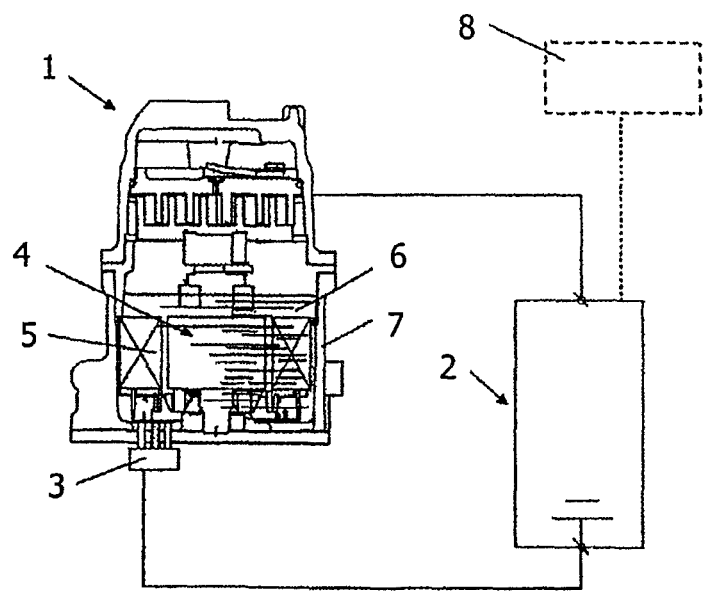
FIG. 1 is an explanatory view of a test device performing a method for testing a leakage current of an electric compressor according to the present invention.

Hereinafter, an embodiment of the present invention will be described in detail with reference to the accompanying drawings. FIG. 1 is an explanatory view of a test device performing a method for testing a leakage current of an electric compressor according to the present invention. Referring to FIG. 1, a current meter 2 is connected to a coil 5 of a motor 4 through a connection terminal 3 of an electric compressor 1 and connected to a housing 7 of the electric compressor 1. An applied voltage of a DC voltage (for example, 500 V) from the current meter 2 is applied between the coil 5 and the housing 7 through the connection terminal 3. The inside of the electric compressor 1 is filled with a dielectric liquid 6, the entire coil 5 is immersed below a liquid level of the dielectric liquid 6, and a space between the coil 5 and the housing 7 is filled with the dielectric liquid 6. As a voltage is applied and so a leakage current is generated from the coil 5, the leakage current is measured by the current meter 2 through the housing 7, and measurement data is collected and analyzed by a personal computer (PC) 8 connected to the current meter 2.

As the dielectric liquid, for example, fluorocarbon-based coolant such as HFC-32, HFC-125, HFC-134, HFC-134a, HFC-143a, HFC-152a, HFC-161, or HFC-1234yf, lubricating oil of polyalkylene glycol-based, polyalkylene glycol ester-based, polyol ester-based, or the like, or a mixture thereof may be used. The dielectric liquid used in the present invention is not limited to the above-mentioned materials, and liquid having volume resistivity equivalent to the above-mentioned materials may be used. Moisture in the dielectric liquid has influence on the test accuracy, and is preferably maintained to be 200 ppm or less.

Figure 2:
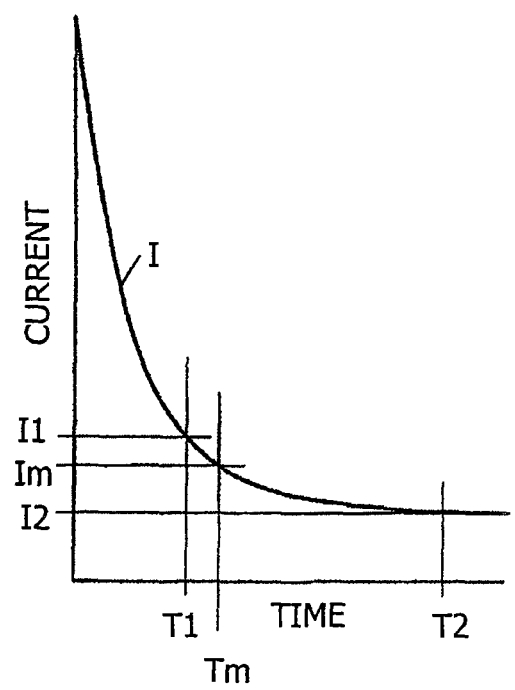
FIG. 2 is an explanatory view for describing a method for testing a leakage current of an electric compressor according to the present invention.

FIG. 2 is an explanatory view for describing a method for testing a leakage current of an electric compressor according to the present invention. When a DC voltage is applied to the coil 5, as illustrated in FIG. 1, the charging current Ii, the absorption current Ia, and the leakage current IL flow between the coil 5 and the housing 7, and the total current I (hereinafter, referred to as a "current") which is a grand total thereof decreases according to a change in the absorption current Ia, gradually the decrease becomes slow, decreases until influence of the absorption current Ia disappears, and finally converges to the leakage current IL. Referring to FIG. 2, according to the present invention, a current I1 when a first predetermined time T1 elapses is measured in a first test process, a current I2 when a second predetermined time T2 elapses is measured in a second test process, and furthermore, a current Im when a predetermined intermediate time Tm elapses is measured in an intermediate test process as necessary. When the second predetermined time T2 (for example, 600 seconds) elapses, the current I2 almost converges to the leakage current IL. Thus, in the present invention, the current I2 when the second predetermined time T2 elapses is regarded as the leakage current IL.

A first reference current value used in the first test process and an intermediate reference current value used in the intermediate test process can be obtained as follows. In other words, first, predetermined dielectric liquid to be used is decided, and a second reference current value serving as an acceptance reference current value when the predetermined dielectric liquid is used is decided as a production performance requirement value. Next, statistical basic data used for deciding the first reference current value and the intermediate reference current value are collected. In order to collect statistical basic data, an enough number of products of electric compressor for regression analysis are prepared as samples. In the electric compressors prepared as the samples, using the above measurement method using the predetermined dielectric liquid, the current value I1 when the first predetermined time T1 elapses, the current value Im when the predetermined intermediate time Tm elapses, and the current value I2 when the second predetermined time T2 elapses are measured, and regression analysis is performed on a variation in the measurement data. In this regression analysis, a regression line is obtained from a variation in measurement data when the current value I1 when the first predetermined time T1 elapses is used as a variable of a vertical axis and the current value I2 when the second predetermined time T2 elapses is used as a variable of a horizontal axis, and a lower limit confidence interval curve of a predictive value is obtained from the variation in the measurement data on the regression line. The first reference current value can be obtained from the lower limit confidence interval curve of the predictive value and the second reference current value. Furthermore, a regression line is obtained from a variation in measurement data when the current value Im when the predetermined intermediate time Tm elapses is used as a variable of the vertical axis, and the current value I2 when the second predetermined time T2 elapses is a variable of the horizontal axis, and a lower limit confidence interval curve of a predictive value is obtained from the variation in the measurement data on the regression line. An intermediate reference current value can be obtained from the lower limit confidence interval curve and the second reference current value. A degree of reliability of the regression line and the lower limit confidence interval curve of the predictive value is preferably 95% or more, and more preferably 99% or more.

When the test method according to the present invention is performed, the same predetermined dielectric liquid as the one used at the time of statistical basic data collection is used. In the first test process, a test product in which the current value I1 when the first predetermined time T1 elapses is less than or equal to the first reference current value is determined as an acceptable product, and a test product in which the current value I1 is greater than the first reference current value is tested again in the second test process. In the second test process, a test product in which the current value is less than or equal to the second reference current value is determined as an acceptable product, and a test product in which the current value is greater than the second reference current value is determined as a disqualified product.

When the intermediate test process is performed, a test product in which the current value is determined to be greater than the first reference current value in the first test process is tested again in the intermediate test process, a test product in which the current value Im when the predetermined intermediate time Tm elapses is less than or equal to the intermediate reference current value is determined as an acceptable product, and a test product in which the current value Im is greater than the intermediate reference current value is tested again in the second test process. In the second test process, a test product in which the current value is less than or equal to the second reference current value is determined as an acceptable product, and a test product in which the current value is greater than the second reference current value is determined as a disqualified product.

EXAMPLES

In order to collect statistical basic data collection, 620 factory products of electric compressors were prepared as samples. Polyalkylene glycol-based lubricating oil (moisture content 150 ppm) was used as dielectric liquid, the inside of the electric compressor of each sample was filled with the lubricating oil, and the entire coil of the motor was immersed below the liquid level of the lubricating oil. In this state, an applied voltage of a DC voltage 500 V was applied from the current meter between the coil and the housing of the compressor, and the current value I1 when the first predetermined time T1 elapses, the current value Im when the predetermined intermediate time Tm elapses, the current value I2 (a leakage current value) when the second predetermined time T2 elapses were measured on the current flowing from the coil to the compressor. In this measurement, the first predetermined time T1 was set to 180 seconds, the predetermined intermediate time Tm was set to 240 seconds, and the second predetermined time T2 was set to 600 seconds. For the second reference current value serving as the acceptance reference current value when the lubricating oil is used as the dielectric liquid, a predetermined value was decided as the production performance requirement value in advance.

Figure 3:
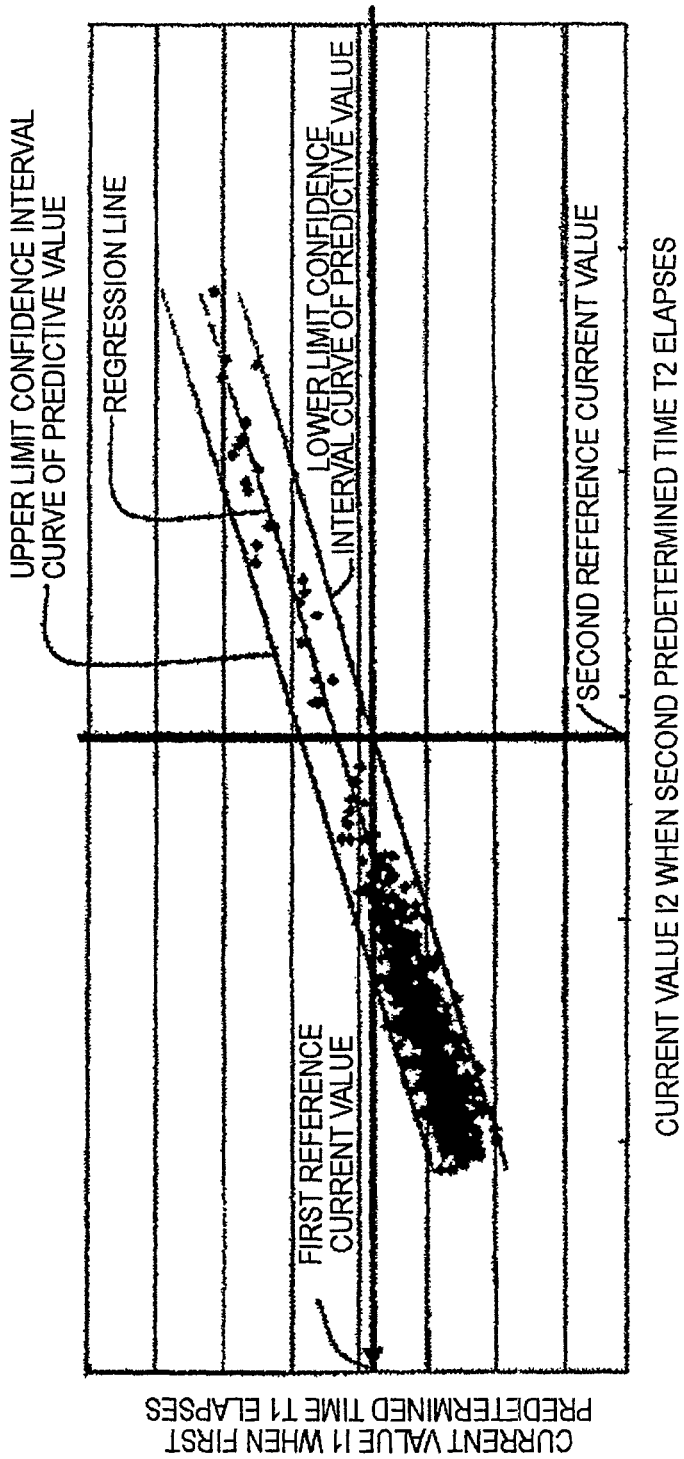
FIG. 3 is an explanatory view illustrating a method of obtaining a first reference current value.

FIG. 3 is an explanatory view illustrating a method of obtaining the first reference current value. Referring to FIG. 3, the current value I1 when the first predetermined time T1 elapses is used as a variable of a vertical axis, the current value I2 when the second predetermined time T2 elapses was used as a variable of a horizontal axis, the regression line of a degree of reliability of 99% was obtained from a variation in measurement data of the current values I1 and the current values I2 of the 620 products, the lower limit confidence interval curve of the predictive value of a degree of reliability of 99% was obtained from the variation in the measurement data on the regression line, and the first reference current value was obtained from a crossing point of the lower limit confidence interval curve and the second reference current value.

Figure 4:
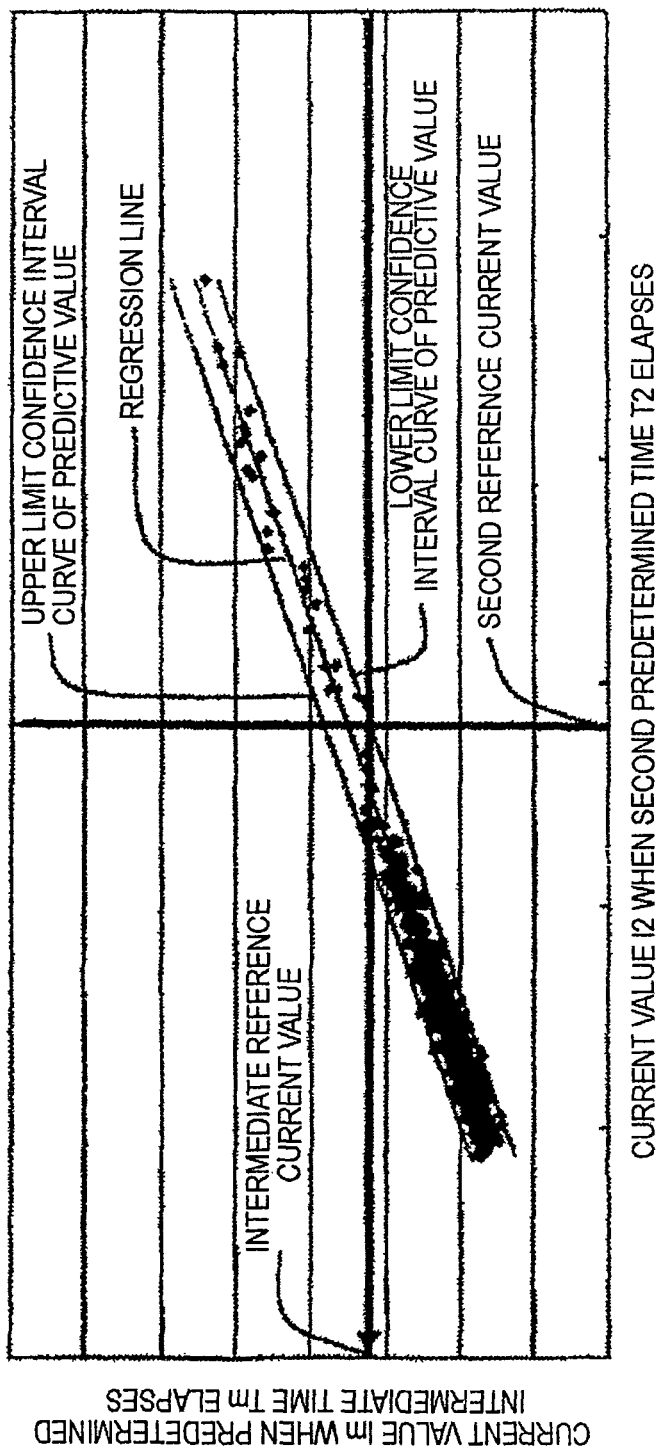
FIG. 4 is an explanatory view illustrating a method of obtaining an intermediate reference current value.
Figure 5:
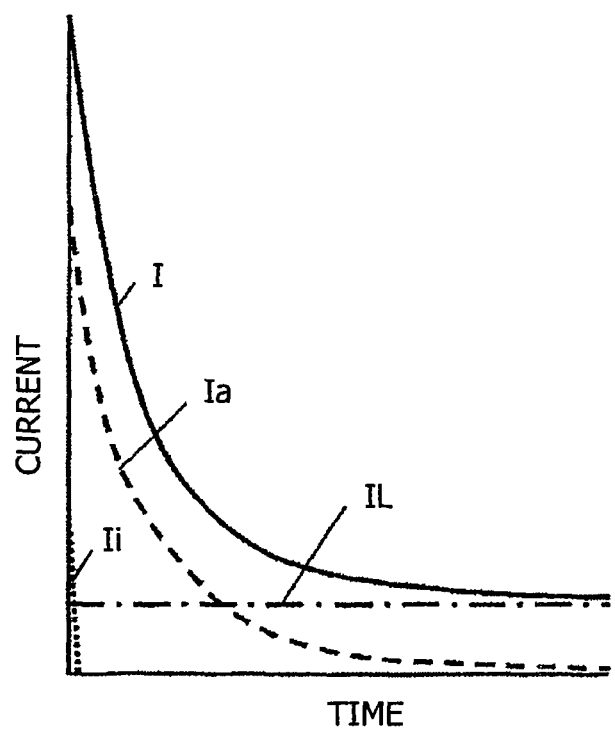
FIG. 5 is an explanatory view illustrating a current flowing to a dielectric when a DC voltage is applied to the dielectric.

FIG. 4 is an explanatory view illustrating a method of obtaining the intermediate reference current value. Referring to FIG. 4, the current value Im when the predetermined intermediate time Tm elapses was used as a variable of the vertical axis, the current value I2 when the second predetermined time T2 elapses was used as a variable of the horizontal axis, the regression line of a degree of reliability of 99% was obtained from a variation in measurement data of the current values Im and the current values I2 of the 620 products, the lower limit confidence interval curve of the predictive value of a degree of reliability of 99% was obtained from the variation in the measurement data on the regression line, and the intermediate reference current value was obtained from a crossing point of the lower limit confidence interval curve and the second reference current value.

A leakage current test was performed on a predetermined number of factory products of electric compressors by a test method having the same condition as described above using the first reference current value, the intermediate reference current value, and the second reference current value. In this test, in the first test process, a test product in which the current value I1 was less than or equal to the first reference current value was determined as the acceptable product, and a test product in which the current value I1 was greater than the first reference current value was tested in the intermediate test process. In the intermediate test process, a test product in which the current value Im was less than or equal to the intermediate reference current value was determined as the acceptable product, and a test product in which the current value Im was greater than the intermediate reference current value was tested in the second test process. A test product in which the current value I2 was less than or equal to the second reference current value was determined as the acceptable product, and a test product in which the current value I2 was greater than the second reference current value was determined as the disqualified product. In this test, in the first test process (the test when 180 seconds elapse), about 75% of all test products were determined as the acceptable product, and in the intermediate test process (the test when 240 seconds elapse), about 25% of all test products which have not been determined as the acceptable product in the first test process were tested, and about 20% of all test products were determined as the acceptable product. Finally, in the second test process (the test when 600 seconds elapse), about 5% of all test products which have not been determined as the acceptable product in the intermediate test process were tested, and a 100% test ended. When a total test time necessary for this test is represented by A, and a total test time necessary when all test products are tested using one acceptance reference current value (the second reference current value) after 600 seconds elapse is represented by B, A:B=(100×180+25×240+5×600):(100×600)=45:100 is established. In other words, through this test, the test time could be reduced by about 55% compared to when all test products are tested using one acceptance reference current value.

INDUSTRIAL APPLICABILITY

According to the present invention, when it is tested whether or not a leakage current leaking from the coil of the motor of the electric compressor to the housing is less than or equal to a reference value, compared to when all products are tested using one acceptance reference current value, a total test time necessary to test all test products can be reduced, and the same test accuracy as all test products are tested using one acceptance reference current value can be obtained. Therefore, the present invention is high in use value as the test method of the leakage current of the electric compressor.

REFERENCE SIGNS LIST

1: Electric compressor
2: Current meter
3: Connection terminal
4: Motor
5: Coil
6: Dielectric liquid
7: Housing
8: Personal computer
T1: First predetermined time
T2: Second predetermined time
Tm: Predetermined intermediate time
I: Total current
I1: Current value when first predetermined time T1 elapses
I2: Current value when the second predetermined time T2 elapses
Im: Current value when predetermined intermediate time Tm elapses
Ia: Absorption current
Ii: Charging current
IL: Leakage current

The invention claimed is:

1. A method for testing a leakage current of an electric compressor in which a predetermined voltage is applied between a coil and a housing of the electric compressor in a state in which an inside of the electric compressor is filled with dielectric liquid and the coil of a motor is immersed in the dielectric liquid, and then, a leakage current flowing from the motor to the housing of the compressor when a predetermined time elapses is tested, the method comprising a first test process and a second test process, the first test process of determining a test product in which a current value when a first predetermined time elapses is less than or equal to a first reference current value as an acceptable product and determining a test product in which the current value is greater than the first reference current value as a test target product of the second test process, and the second test process of determining, among the test products in which the current value is determined to be greater than the first reference current value in the first test process, a test product in which a current value when a second predetermined time longer than the first predetermined time elapses is less than or equal to a second reference current value as an acceptable product, and determining a test product in which the current value is greater than the second reference current value as a disqualified product, wherein the first reference current value is a predictive reference current value that allows a test product which is to be determined as a disqualified product in the second test process to be determined as a disqualified product in the first test process, and allows some test products which are to be determined as an acceptable product in the second test process to be determined as a disqualified product in the first test process, and the second reference current value is an acceptance reference current value used to finally decide whether or not a leakage current of a test product is acceptable.

2. The method for testing a leakage current of an electric compressor according to claim 1, further comprising:

an intermediate test process between the first test process and the second test process, the intermediate test process determining a test product in which the current value is greater than the first reference current value in the first test process as a test target, wherein a test product in which a current value when a predetermined intermediate time between the first predetermined time and the second predetermined time elapses is less than or equal to an intermediate reference current value is determined as an acceptable product, and a test product in which the current value is greater than the intermediate reference current value is determined as a test target product in the second test process, and the intermediate reference current value is an intermediate value between the first reference current value and the second reference current value, and is a predictive reference current value that allows a test product which is to be determined as a disqualified product in the second test process to be determined as a disqualified product in the intermediate test process, and allows some test products which are to be determined as an acceptable product in the second test process to be determined as a disqualified product in the intermediate test process.

3. The method for testing a leakage current of an electric compressor according to claim 1, wherein based on measurement data of a current value when the first predetermined time elapses and a current value when the second predetermined time elapses in a plurality of electric compressors serving as a sample, a lower limit confidence interval curve of a predictive value is obtained by a regression analysis method, and the first reference current value is obtained using the lower limit confidence interval curve and the second reference current value.

4. The method for testing a leakage current of an electric compressor according to claim 2, wherein based on measurement data of a current value when a predetermined intermediate time between the first predetermined time and the second predetermined time elapses and a current value when the second predetermined time elapses in a plurality of electric compressors serving as a sample, a lower limit confidence interval curve of a predictive value is obtained by a regression analysis method, and the intermediate reference current value is obtained using the lower limit confidence interval curve and the second reference current value.

5. The method for testing a leakage current of an electric compressor according to claim 1, wherein the dielectric liquid is a coolant, lubricating oil, or a mixture thereof.

6. The method for testing a leakage current of an electric compressor according to claim 5, wherein moisture content of the dielectric liquid is 200 ppm or less.

* * * * *